US009559663B2

(12) United States Patent
Knierim

(10) Patent No.: US 9,559,663 B2
(45) Date of Patent: Jan. 31, 2017

(54) ELECTRONICALLY VARIABLE ANALOG DELAY LINE

(71) Applicant: Tektronix, Inc., Beaverton, OR (US)

(72) Inventor: Daniel G. Knierim, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/745,711

(22) Filed: Jun. 22, 2015

(65) Prior Publication Data

US 2016/0373087 A1 Dec. 22, 2016

(51) Int. Cl.
*H03H 11/26* (2006.01)
*H03K 5/13* (2014.01)
*H03K 5/00* (2006.01)

(52) U.S. Cl.
CPC ............ *H03H 11/265* (2013.01); *H03K 5/133* (2013.01); *H03K 2005/00045* (2013.01)

(58) Field of Classification Search
CPC ...... B60R 21/0152; C02F 1/001; C02F 1/008; A61L 2/10
See application file for complete search history.

(56) References Cited

U.S. PATENT DOCUMENTS 4,205,282 A 5/1980 Gipprich
2009/0315641 A1* 12/2009 Ding ......................... H01P 9/00 333/161
2012/0102444 A1* 4/2012 Ding ......................... H01P 1/15 716/111
2014/0152399 A1 6/2014 Ehyaie et al.

FOREIGN PATENT DOCUMENTS

FR 2706098 A1 12/1994

OTHER PUBLICATIONS

Extended European Search Report for European Patent Application No. 16175810.7, mailed Oct. 26, 2016.

* cited by examiner

*Primary Examiner* — Sibin Chen
(74) *Attorney, Agent, or Firm* — Marger Johnson

(57) ABSTRACT

An electronically variable analog delay line including at least one segment with an electronically variable inductance. The at least one segment includes a signal path, a ground return path, and a plurality of switches configured to vary the inductance of the segment.

11 Claims, 3 Drawing Sheets

200

42 38 24 48 46 26
44 28 52 32
selc selc selc selc
in 16 out
22
18 34 20
sell

ELECTRONICALLY VARIABLE ANALOG DELAY LINE

TECHNICAL FIELD

This disclosure relates to an electronically variable analog delay line with a signal path and a ground return path to electronically vary the inductance of the electronically variable analog delay line in a short-delay mode and a long-delay mode.

BACKGROUND

Differential input probes are commonly used to acquire a nominally differential signal, such as on a high-speed serial data bus, from a device under test (DUT) using a single test and measurement instrument channel. TriMode™ probes have the additional capability of acquiring the common-mode signal, or either side of the differential pair signal as a single-ended signal.

An ideal differential signal includes two complementary signals sent on two separate wires. Any skew, or difference in delay, between the two sides of wiring in a DUT to the test and measurement instrument and/or within the test and measurement instrument itself causes mode conversion of the differential signal. Mode conversion is when a portion of the differential signal appears as the common-mode signal, or vice versa. Mode conversion due to skew grows progressively worse at higher frequencies. For instance, just one picosecond (ps) of skew at 25 GHz will lead to over 15% of the common-mode voltage appearing as a differential signal.

One approach to minimizing errors due to the skew-related mode conversion is discussed in co-pending U.S. application Ser. No. 14/745,757, titled TRI-MODE PROBE WITH AUTOMATIC SKEW ADJUSTMENT, filed Jun. 22, 2015, and incorporated herein by reference in its entirety.

The electronically variable delays in U.S. application Ser. No. 14/745,757 may be broad-band, DC-coupled, electronically adjustable analog delay lines implemented as lumped-element transmission lines using fixed inductors and varactors (voltage-variable capacitors). However, such type of electronically adjustable analog delay line causes the characteristic impedance to vary along with the delay, thus requiring the ratio of maximum-to-minimum delay to be no bigger than the allowed ratio of impedances to maintain satisfactory termination. This limited ratio generally leads to a nominal delay much longer than the needed delay range, which in turn leads to higher insertion loss than desired. Also, the varactors will respond to the signal voltage as well as the adjustable bias voltage, causing some signal non-linearity.

Another known approach is to build a segmented delay line with microelectromechanical systems (MEMs) switches configured to switch in or out different segment lengths to implement a stepped delay control. This approach avoids the change in characteristic impedance with delay, but requires a specialized manufacturing process and may suffer significant insertion loss due to contact resistance of the MEMs switches.

Yet another approach is the use of switched active delay elements (e.g., unity gain amplifiers that impart a relatively known delay to the signal). This approach is compatible with standard integrated chip (IC) processes, but degrades signal-to-noise ratio due to noise generation in the active stages, and may require more operational power than other approaches.

Embodiments of the disclosed technology address these and other limitations in the prior art.

SUMMARY

Embodiments of the disclosed technology include an electronically variable analog delay line, including at least one segment with an electronically variable inductance. The at least one segment includes a signal path, a ground return path, and a plurality of switches configured to vary the inductance of the segment.

Embodiments of the disclosed technology also include a method for delaying a signal on an electronically variable analog delay line. The method includes switching between a short-delay mode and a long-delay mode, sending a signal on a signal path, adding capacitance to the signal path when in the long-delay mode to delay the signal by a first amount, and grounding a ground return path via turning on a first switch located at one end of the ground return path and a second switch located at the other end of the ground return path when in the short-delay mode to delay the signal by a second amount.

DETAILED DESCRIPTION

Figure 1:
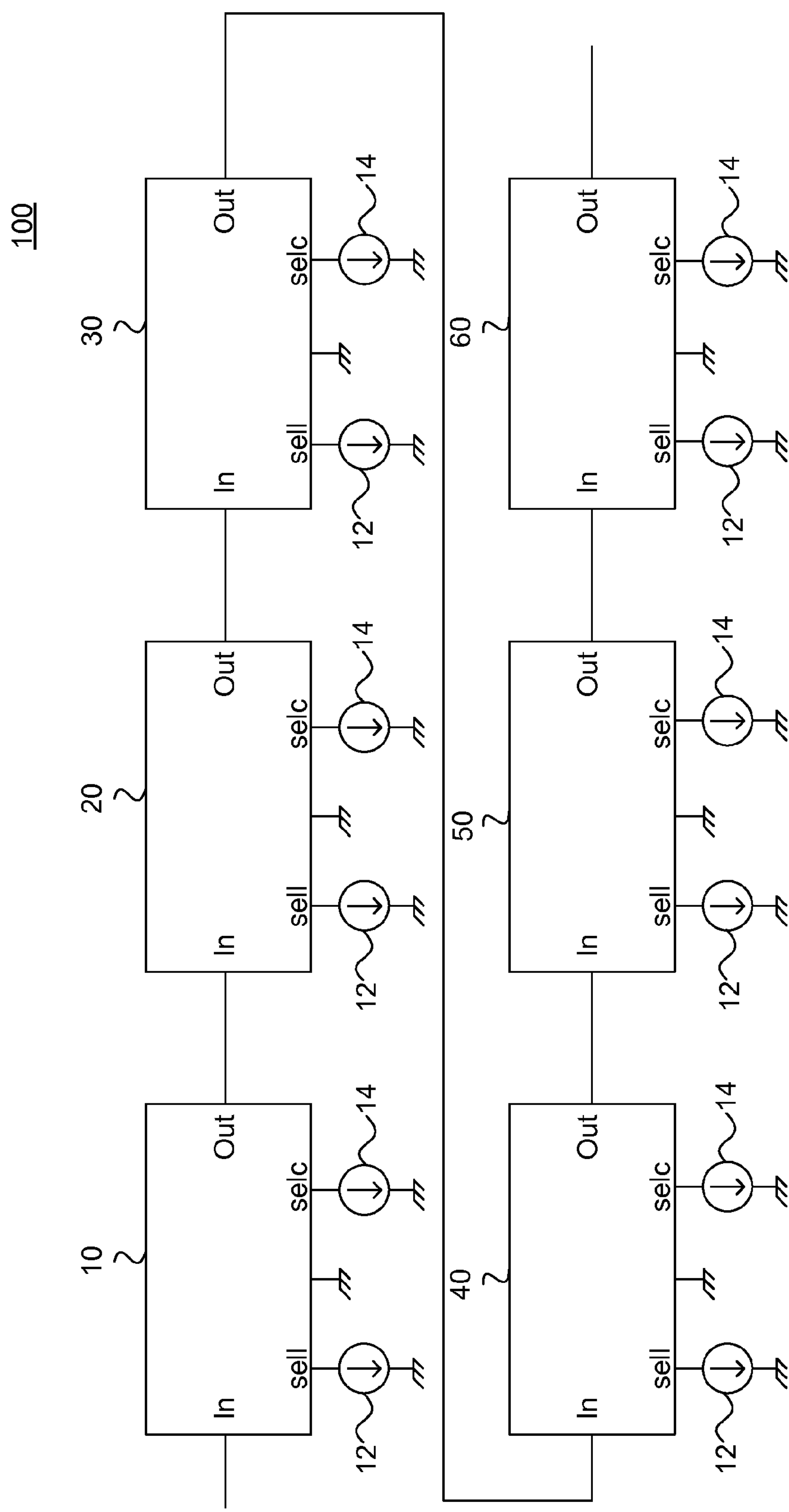
FIG. 1 shows an electronically variable analog delay line with multiple segments according to embodiments of the disclosed technology.

In the drawings, which are not necessarily to scale, like or corresponding elements of the disclosed systems and methods are denoted by the same reference numerals.

Figure 2:
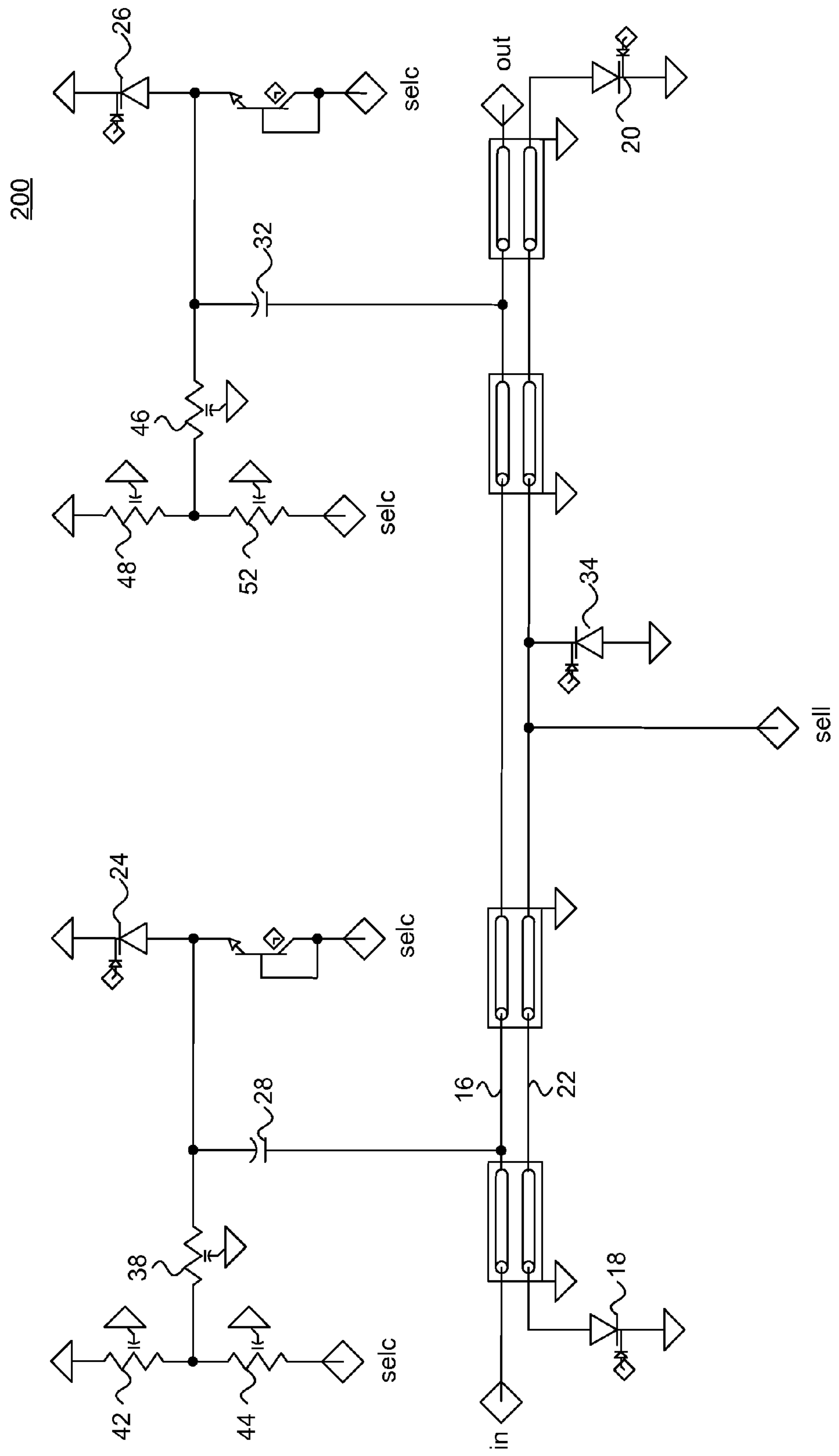
FIG. 2 illustrates a segment of the electronically variable analog delay line of FIG. 1 according to some embodiments of the disclosed technology.

FIG. 1 illustrates a lumped-element transmission line built using segments of coupled transmission lines, capacitors and switches, while FIG. 2 illustrates an example segment.

FIG. 1 shows a six-segment electronically variable analog delay line 100 with four equal delay segments 10, 20, 30, and 40, with switchable delays of nominally 4 ps (in the short-delay mode) or 6.4 ps (in the long-delay mode), followed by two additional segments 50 and 60 with roughly a half and a quarter of the length. For example, segment 50 may be 0.5 the length of the four equal delay segments (resulting in a delay of nominally 2 ps in the short-delay mode and 3.2 ps in the long-delay mode) while segment 60 is 0.25 the length of the four equal delay segments (resulting in a delay nominally of 1 ps in the short-delay mode and 1.6 ps in the long-delay mode). This provides a net delay range of nominally 12 ps and a delay resolution of nominally 0.6 ps. The 6.4 ps maximum delay per segment is below a quarter wavelength well past the desired 25 GHz operating frequency range of this example circuit. As discussed in more detail below, the maximum delay per segment must be below a quarter wavelength of the desired operating frequency.

Two control currents 12 and 14 are shown for each segment. Control current 12 controls the switches in the ground return path line 22 to adjust the effective line inductance, and control current 14 controls the switches in series with the extra capacitors to adjust the effective line capacitance. In operation, both control currents 12 and 14 for each segments are switched together to adjust delay while maintaining characteristic impedance nominally constant. For test and evaluation purposes, however, it may be advantageous to allow independent switching so as to distinguish the two effects.

To create an adjustable delay, segments 10-60 may be switched in short-delay or long-delay mode to get the desired amount of time delay. Although six segments are shown in FIG. 1, any number of segments may be used to reach the desired delay time and resolution.

FIG. 2 shows a schematic of one delay segment 200. The delay segment 200 may be anyone of the delay elements 10-60 discussed above. Each of the delay segments include an identical schematic, although the various values of the components and lengths may be adjusted based on the desired delay time. The basic delay is provided by a coupled transmission line pair with, as an example, an even mode impedance of 129Ω, an odd mode impedance of 31Ω, and a uniform dielectric (thus, the same propagation speed for even and odd modes). However, any type of transmission line may be used and the disclosed embodiments are not limited to the example values. The example transmission line is commonly realizable on IC processes. For instance, two 4.0 μm tall, 4.2 μm wide lines with 3.5 μm spacing placed 12.4 μm above a ground plane in $SiO_2$ dielectric will approximate these impedances.

One of the coupled lines, signal line 16, in each segment carries the signal to be delayed while the other line is switched selectively as part of the ground return path. In some embodiments, the switches may be PIN diode switches. In a short-delay mode, each end of the ground return path line 22 is switched to ground, placing ground return path line 22 in parallel with the common ground, lowering the net inductance of the signal line 16 in that segment. In the short-delay mode, the signal travels the signal line 16 essentially at the speed of light. In a long-delay mode, the ends of ground return path line 22 are not grounded, which forces the ground return current through the common ground, increasing the inductance of the signal line 16 in that segment. Additionally, the center of ground return path line 22 is switched to ground, so as to maintain the mutual capacitance of the lines, and extra capacitance is switched onto the signal line 16 to raise the segment capacitance by the same ratio as the inductance was raised. This increases the delay of the segment by that same ratio, while leaving the characteristic impedance unchanged.

Segments of the lumped-element transmission line may be switched independently, so as to provide multiple steps in the overall delay, as discussed in more detail below. Segment lengths are set short enough to meet the desired delay resolution and to minimize the impact of reflections on the open-circuit ends of the ground return path line 22 in the segments switched for the long-delay mode.

The signal to be delayed travels down signal line 16 of the coupled transmission line pair from node "in" to node "out." When DC control current 12 is sourced into control node "sell," the current will flow through the second line to PIN diode switches 18 and 20, causing them to switch ON to a low impedance. This places ground return path line 22 in parallel with the common ground plane, lowering the impedance of line 16 to:

$$Z=2/(1/\text{Zeven}+1/\text{Zodd})\approx 50\Omega \tag{1}$$

If control node "selc" is held below ground, reverse biasing PIN diode switches 24 and 26 to switch them OFF, the extra capacitors 28 and 32 are effectively removed from loading signal line 16, maintaining the desired 50Ω impedance. In this control state, the delay of the segment will equal the inherent delay of the coupled transmission lines, which is roughly 1 ps for each 150 μm of length in $SiO_2$ or 4 ps in this example. That is, in this example, the segment 200 is in the short-delay mode.

Resistors 38, 42, 44, 46, 48, and 52 are present to insure diode switches 24 and 26 remain reverse-biased even in the presence of signal coupling through capacitors 28 and 32, but are chosen high enough in value to not represent a significant load on the AC signal coupled through the capacitors. For example, resistors 38 and 46 may be 20 kΩ resistors 42 and 48 may be 14 kΩ and resistors 44 and 52 may be 6 kΩ. When the segment is in the short-delay mode, these resistors set the reverse bias level on diode switches 24 and 26 to keep them from turning on.

However, to place the segment 200 in the long-delay mode, the polarity of the control current 12 in control node "sell" is reversed so PIN diodes switches 18 and 20 will switch OFF and PIN diode switch 34 will switch ON instead. This continues to hold the ground return path line 22 at ground, maintaining the effect of mutual capacitance between the lines as capacitance to ground. Although three PIN diode switches 18, 20, and 34 are shown in FIG. 2, in alternative embodiments, one end of the ground return path line 22 could be permanently grounded while the other end of the ground return path line 22 is switched to ground or left open. The capacitance of the signal line 16 remains:

$$C=Td/Z=Td*(1/\text{Zeven}+1/\text{Zodd})/2\approx 80\text{ fF} \tag{2}$$

But, the signal's ground return current can no longer flow along the line 22 with the ends open, so the impact of the mutual inductance between the lines 16 and 22 is broken. The signal line 16 impedance if the ground return path line 22 is floating is:

$$Z=(\text{Zeven}+\text{Zodd})/2\approx 80\Omega \tag{3}$$

Thus, the resulting signal line 16 inductance without the ground return path line 22 as a ground return path is:

$$L=Td*Z=Td*(\text{Zeven}+\text{Zodd})/2\approx 320\text{ pH} \tag{4}$$

DC control current 14 sourced into control node "selc" will flow into PIN diode switches 24 and 26, switching them ON and placing capacitors 28 and 32 in parallel with the signal line 16. This extra capacitance (that is, the sum of capacitors 28 and 32) may be set to:

$$\text{Cextra}=Td*(\text{Zeven}/\text{Zodd}^2-1/\text{Zodd}-1/\text{Zeven}+\text{Zodd}/\text{Zeven}^2)/8\approx 48\text{ fF} \tag{5}$$

If Cextra is set as shown in equation (5), the lumped-element equivalent transmission line impedance for the segment will be the same as for the short-delay control state, but the delay will have increased by a ratio of:

$$\text{Delay ratio}=(\text{Zeven}+\text{Zodd})^2/(4*\text{Zeven}*\text{Zodd})\approx 1.6 \tag{6}$$

Tighter coupling of the lines will provide even higher delay ratios. For practical levels of line coupling in typical IC design processes, the delay ratio of a segment may reach 2:1 or more, much higher than would be acceptable for an impedance ratio in a capacitor-only tuning method. As seen in FIG. 2, the PIN diode switches 24 and 26 in the disclosed technology are placed either in the ground return path 22 or in series with a capacitor. Thus, the switches 24 and 26 do not see and are not affected by the DC signal level, avoiding the delay change and non-linearity of the varactor approach discussed above.

Segment length may be limited either by desired delay resolution or by keeping the segment delay well below the quarter wave length criteria for lumped element delay lines. As mentioned above, the lumped element delay segments should be kept below a quarter wavelength of the desired operating frequency range. Only a few binary-weighted segments need to be limited by the desired delay resolution, but all segments need to be well below the quarter wave length criteria for lumped element delay lines. For example, as mentioned above, segments 50 and 60 are limited by the desired resolution, while the remaining segments 10-40 provide the maximum delay amount per segment, while being below a quarter wavelength of the desired operating frequency.

Higher line coupling provides for a higher delay ratio, and thus shorter total delay to achieve a target delay ranger. However, for a fixed target impedance (2/(1/Zeven+1/Zodd)), this requires a higher value of Zeven, which implies skinnier signal lines and more resistive loss in the conductor for a given delay. For any particular process and target impedance, there will be an optimal line coupling that minimizes loss by trading off between too long of a delay (at low coupling) versus too much loss per unit delay (at high coupling).

The optimal sizing of PIN diode switches 18, 20, 24, 26, and 34 is generally a trade-off between ON resistance (favoring a large area to lower resistance) and OFF capacitance (favoring a small area to lower capacitance). Too much ON resistance in PIN diode switches 18 and 20 will add loss to the segment in the short-delay mode, whereas too much OFF capacitance will allow some high frequency current to flow out the ends of the lines, lowering the high frequency inductance and changing the delay in the long-delay mode.

Likewise, too much ON resistance in PIN diode switches 24 and 26 will add high frequency loss to the segment in the long-delay mode, whereas too much OFF capacitance will impact the impedance and delay of the segment in the short-delay mode.

PIN diode switch 34 is unique in that it must be sized large to maintain a low ON resistance for low high frequency loss, but is rather insensitive to OFF capacitance as there is nominally no signal voltage present at that node in either delay mode.

In the long-delay mode, the dominant line loss is the combination of resistive loss in the signal line 16 and in the ground plane underneath. In short-delay mode, the parallel ground return path 22 through the coupled line serves to lower the ground loss, but ON resistance in the switches in the coupled line serves to raise ground loss. Proper sizing of the ground plane and switch resistance can match these effects, so loss is nominally the same in either delay mode. Although not shown, an alternate ground connection some distance away from the coupled line structure with a much lower resistance may be used if desired to minimize ground loss at low frequencies, in both delay modes, while still allowing matching of ground return loss at the higher frequencies where mutual inductance forces the ground return current into the ground plane underneath the coupled lines (and in the short-delay mode, into the grounded coupled line as well).

Figure 3:
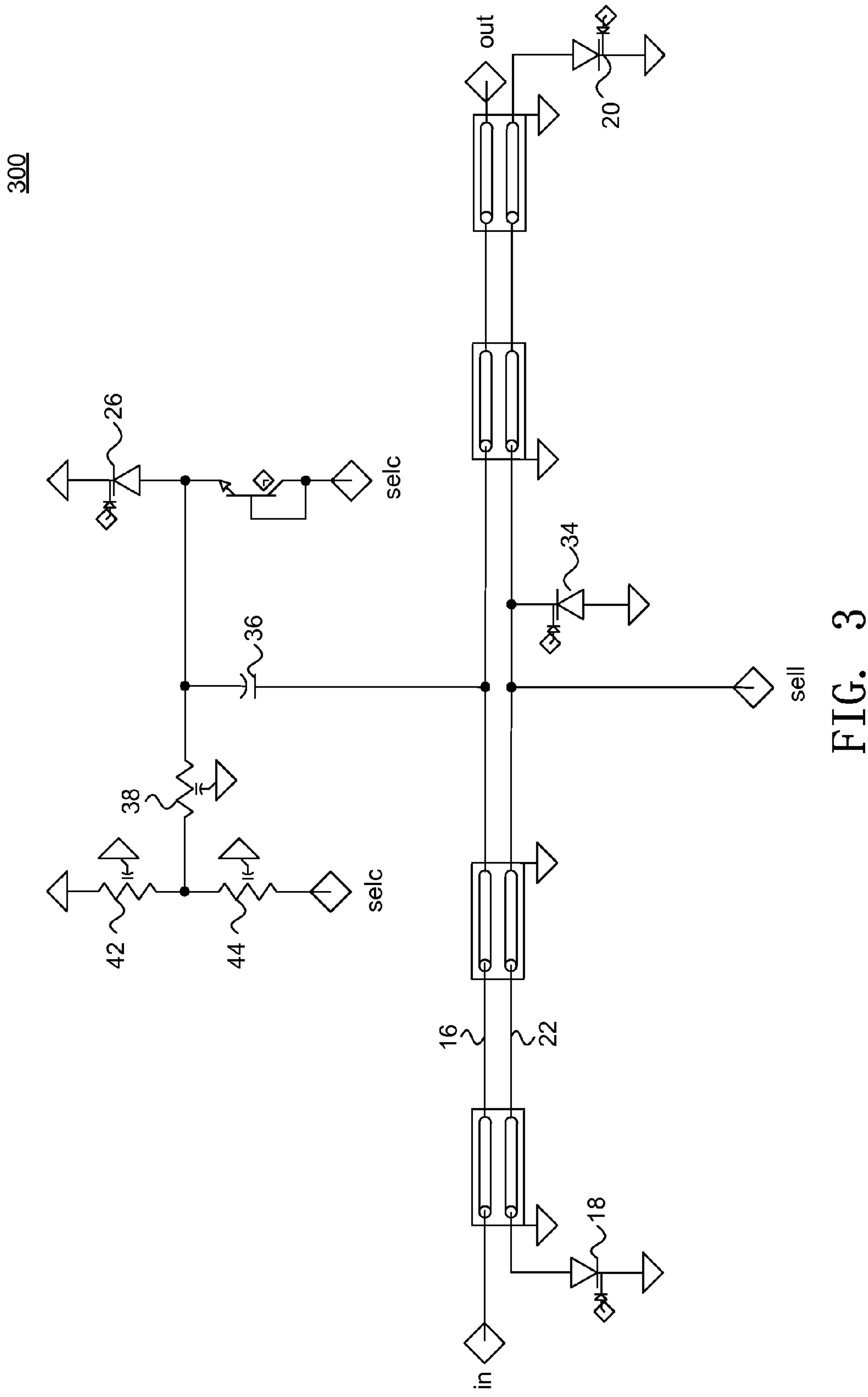
FIG. 3 illustrates a segment of the electronically variable analog delay line of FIG. 1 according to other embodiments of the disclosed technology.

Other adjustments may be made based on circuit simulation and practical requirements. For instance, if some amount of impedance variation is acceptable, the effective delay range of a segment may be increased by selecting a higher value for Cextra than shown in equation (5). Also, although Cextra is shown as being added in two lumps at the one-quarter and three-quarter points along the segment lines, a different number and/or placement of the extra capacitance may be preferred, depending on the details of the layout and associated parasitics. For example, as seen in FIG. 3, showing an alternative segment 300, Cextra may be added as a single capacitor 36 in the middle of the signal line 16.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. An electronically variable analog delay line, comprising:

at least one segment with an electronically variable inductance, the at least one segment including:

a signal path;

a ground return path; and one or more switches configured to vary the inductance of the segment;

wherein the at least one segment includes a short-delay mode and a long-delay mode, and the at least one segment is configured to delay a signal in the signal delay path a first delay amount in the short-delay mode and a second delay amount in the long-delay mode; and wherein the one or more switches includes three switches, two of the switches connected to ground at the ends of the ground return path, and the other of the switches connected to ground at the center of the ground return path.

2. The electronically variable analog delay line of claim 1, wherein during the short-delay mode, the two switches connected to ground at the ends of the ground return path are on, and the other of the switches is off, and during the long-delay mode, the two switches connected to ground at the ends of the ground return path are off, and the other of the switches is on.

3. The electronically variable analog delay line of claim 2, the at least one segment further comprising at least one capacitor configured to add capacitance to the signal path during the long-delay mode.

4. The electronically variable analog delay line of claim 3, wherein the capacitance added is the same ratio as the variance of inductance.

5. The electronically variable analog delay line of claim 1, wherein the impedance of the electronically variable analog delay line is substantially unchanged between the short-delay mode and the long-delay mode.

6. The electronically variable analog delay line of claim 1, further comprising at least two segments with the electronically variable inductance.

7. The electronically variable analog delay line of claim 6, wherein one segment of the at least two segments includes a different delay time in the short-delay mode and the long-delay mode than the other segment of the at least two segments.

8. The electronically variable analog delay line of claim 1, further comprising two switches to vary the inductance of the segment.

9. A method for delaying a signal on an electronically variable analog delay line, comprising:

switching between a short-delay mode and a long-delay mode;

sending a signal on a signal path;

adding capacitance to the signal path when in the long-delay mode to delay the signal by a first amount; and grounding a ground return path via turning on a first switch located at one end of the ground return path and a second switch located at the other end of the ground return path when in the short-delay mode to delay the signal by a second amount;

wherein adding capacitance to the signal path when in the long-delay mode further includes turning on a center switch of the ground return path and turning off the first switch and the second switch of the ground return path.

10. The method of claim 9, further comprising varying the inductance of the electronically variable analog delay line between the short-delay mode and the long-delay mode.

11. The method of claim 9, wherein the impedance of the electronically variable analog delay line is substantially unchanged between the short-delay mode and the long-delay mode.

* * * * *